(12) United States Patent
Shishido et al.

(10) Patent No.: US 9,354,049 B2
(45) Date of Patent: May 31, 2016

(54) SHAPE MEASUREMENT METHOD, AND SYSTEM THEREFOR

(75) Inventors: Chie Shishido, Kawasaki (JP); Maki Tanaka, Tokyo (JP); Atsushi Miyamoto, Yokohama (JP); Akira Hamamatsu, Mito (JP); Manabu Yano, Hitachiomiya (JP)

(73) Assignee: HUTACHI HIGH-TECHNOLOGIES CORPORATION, Tokyo (JP)

( * ) Notice: Subject to any disclaimer, the term of this patent is extended or adjusted under 35 U.S.C. 154(b) by 596 days.

(21) Appl. No.: 13/880,429

(22) PCT Filed: Oct. 21, 2011

(86) PCT No.: PCT/JP2011/074367
§ 371 (c)(1),
(2), (4) Date: Jun. 7, 2013

(87) PCT Pub. No.: WO2012/053650
PCT Pub. Date: Apr. 26, 2012

(65) Prior Publication Data
US 2013/0262027 A1      Oct. 3, 2013

(30) Foreign Application Priority Data

Oct. 22, 2010   (JP) .................................. 2010-237315

(51) Int. Cl.
*G01B 21/04*   (2006.01)
*G01B 15/04*   (2006.01)
*H01L 21/66*   (2006.01)

(52) U.S. Cl.
CPC .............. *G01B 21/04* (2013.01); *G01B 15/04* (2013.01); *H01L 22/12* (2013.01)

(58) Field of Classification Search
CPC .................. H01L 2924/0002; H01L 2924/00; H01L 22/34; H01L 22/12; G01B 15/04; G01B 21/04; G01B 21/956; G06T 2207/30148; G06T 7/0004; H01J 2237/2816

USPC .............. 702/66, 67, 71, 94, 124, 150, 155; 250/306, 307, 310, 311, 492.3; 382/145
See application file for complete search history.

(56) References Cited

U.S. PATENT DOCUMENTS 4,264,822 A    4/1981  Ueno et al.
7,078,688 B2 *  7/2006  Kazui ................... G01B 15/04
                                        250/306

(Continued)

FOREIGN PATENT DOCUMENTS

JP          55-72807       6/1980
JP        2005-156436      6/2005

(Continued)

OTHER PUBLICATIONS

Office Action in JP 2010-237315, dispatched Oct. 1, 2013 (in Japanese, 3 pgs.) with partial English language translation.

(Continued)

*Primary Examiner* — John H Le
(74) *Attorney, Agent, or Firm* — Baker Botts, L.L.P.

(57) ABSTRACT

A model based measurement method is capable of estimating a cross-sectional shape by matching various pre-created cross-sectional shapes with a library of SEM signal waveforms. The present invention provides a function for determining whether or not it is appropriate to create a model of a cross-sectional shape or a function for verifying the accuracy of estimation results to a conventional model based measurement method, wherein a solution space (expected solution space) is obtained by matching library waveforms and is displayed before measuring the real pattern by means of model based measurement. Moreover, after the real pattern is measured by means of model based measurement, the solution space (real solution space) is obtained by matching the real waveforms with the library waveforms and is displayed.

8 Claims, 20 Drawing Sheets

(56) References Cited

U.S. PATENT DOCUMENTS

| | | | |
|---|---|---|---|
| 8,110,800 B2* | 2/2012 | Shishido | G03F 1/0092 250/306 |
| 2005/0100205 A1* | 5/2005 | Shishido | G06T 7/0004 382/145 |
| 2007/0187595 A1 | 8/2007 | Tanaka et al. | |
| 2009/0214103 A1 | 8/2009 | Tanaka et al. | |

FOREIGN PATENT DOCUMENTS

| | | |
|---|---|---|
| JP | 2005-189137 | 7/2005 |
| JP | 2007-218711 | 8/2007 |
| JP | 2009-117691 | 5/2009 |
| JP | 2009-198339 | 9/2009 |

OTHER PUBLICATIONS

Shishido, C. et al; CD Bias Reduction in CD-SEM of Very Small Line Patterns: Sidewall Shape Measurement Using Model-Based Library Matching Method (pp. 763831-1-763831-13 Metrology, Inspection, and Process Control for Microlithography XXIV, edited by Christopher J. Raymond, ); SPIE, vol. 7638; SPIE copyright 2010.

Report on roadmap of semiconductor equipment: Book 5 measurement, 2005.

J. S. Villarrubia et al., Scanning electron microscope analog of scatterometry, Metrology, Inspection, and Process Control for Microlithography XVI, Daniel J. C. Herr, Proceedings of SPIE, 2002, p. 304-312, vol. 4689.

* cited by examiner

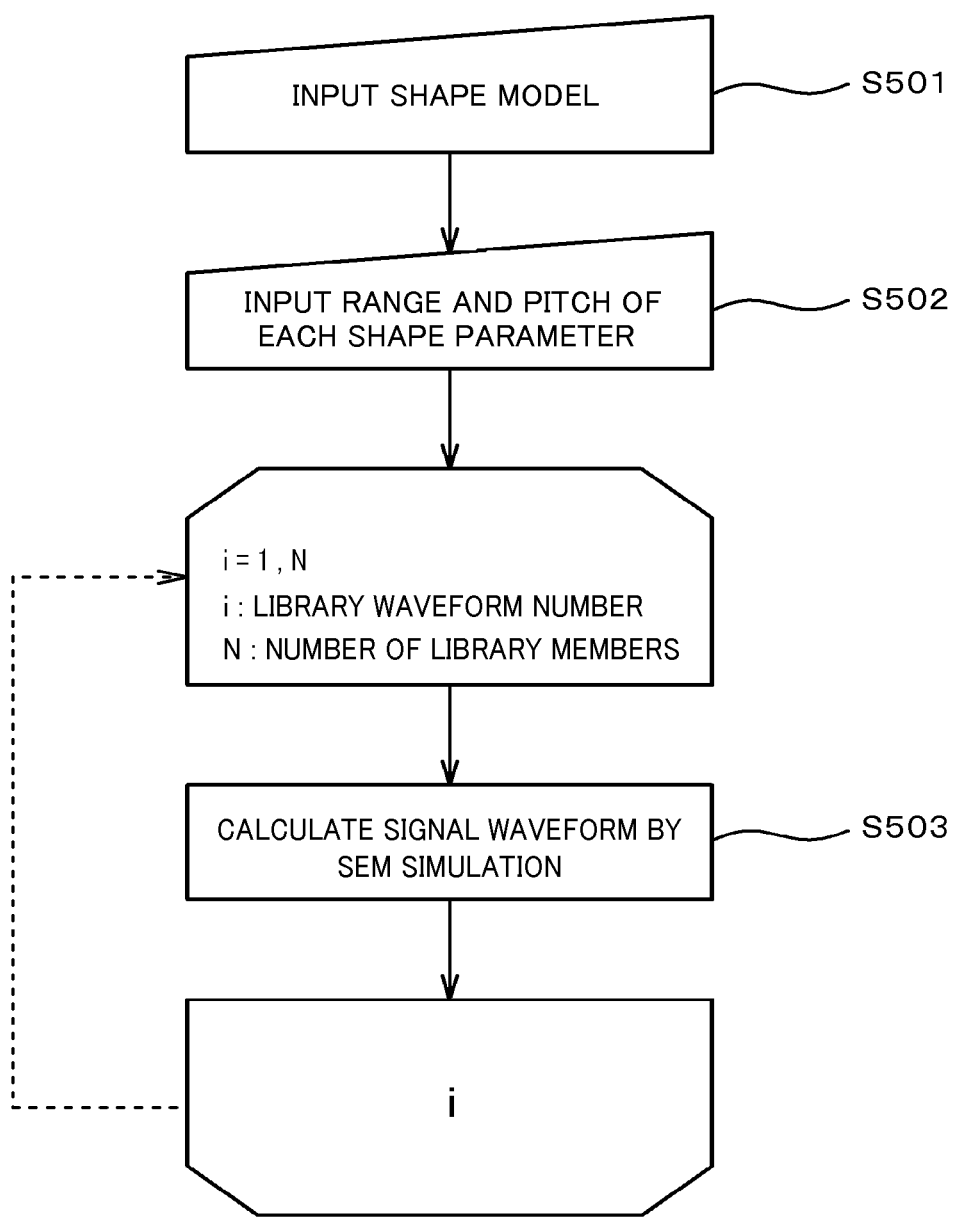

| NUMBER OF TRAPEZOIDS | 2 |
|---|---|
| ROUNDNESS OF TOP | ROUND |
| ROUNDNESS OF BOTTOM | NOT ROUND |

602

603

| | RANGE | | PITCH |
| | START | END | |
|---|---|---|---|
| ROUNDNESS OF TOP | 0 nm | 15 nm | 5 nm |
| UPPER SIDE WALL INCLINATION ANGLE | 5 ° | 15 ° | 1 ° |
| LOWER SIDE WALL INCLINATION ANGLE | 0 ° | 10 ° | 1 ° |

FIG. 8A
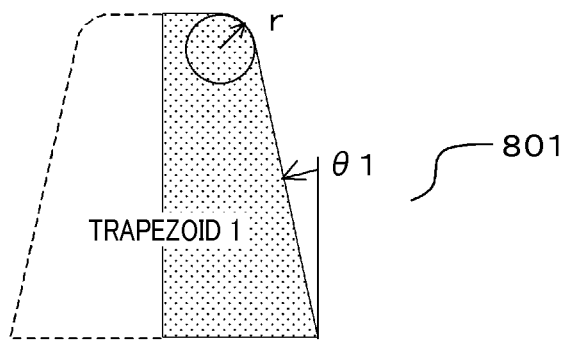
FIG. 8B
| SHAPE PARAMETER | NOMINAL VALUE |
|---|---|
| ROUNDNESS OF TOP (r) | 5 nm |
| SIDE WALL INCLINATION ANGLE ($\theta 1$) | 2 ° |
802
FIG. 8C
| NOISE LEVEL (N/S) | 5 % |
|---|---|
803
FIG. 8D          FIG. 8E
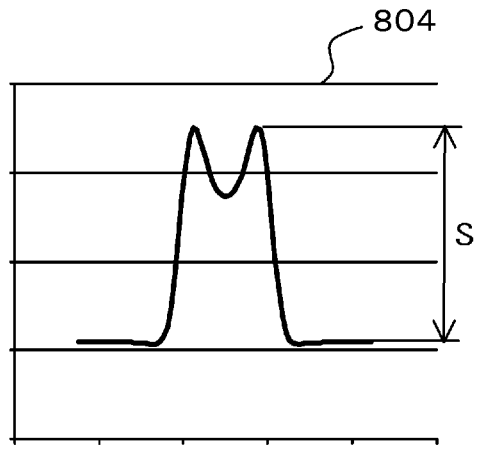
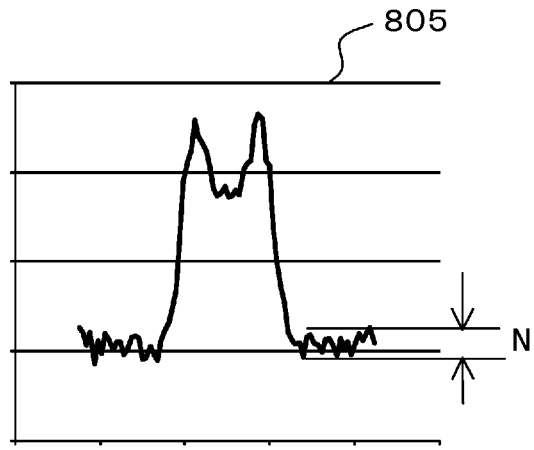

FIXED TOP ROUNDNESS
($r = r_{nominal}$)

FIXED LOWER SIDE WALL INCLINATION ANGLE
($\theta 2 = \theta 2_{nominal}$)

FIXED UPPER SIDE WALL INCLINATION ANGLE
($\theta 1 = \theta 1_{nominal}$)

REAL SOLUTION SPACE

REFERENCE SOLUTION SPACE

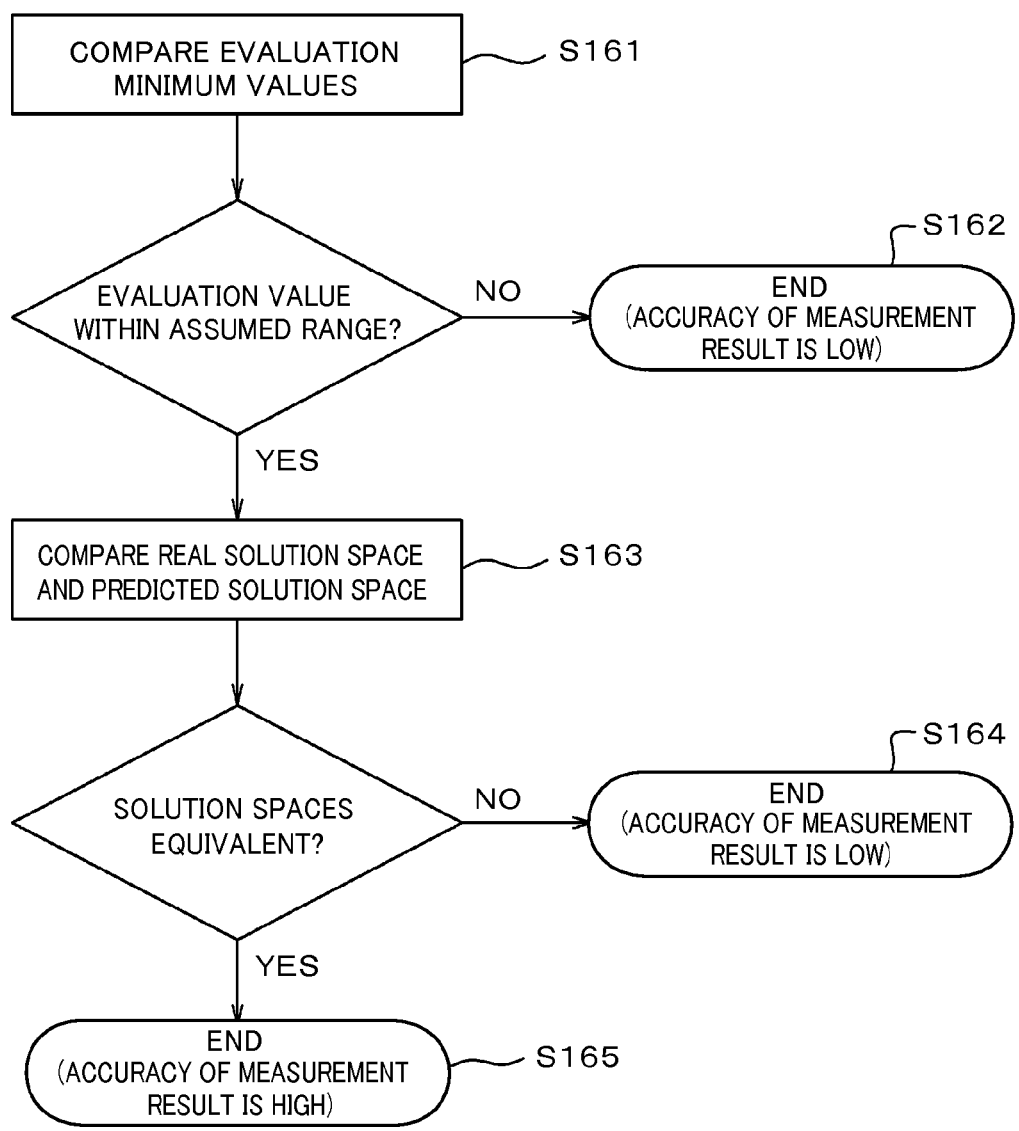

FIG. 18
| | ACCELERATING VOLTAGE | ENERGY FILTER No.1 | ENERGY FILTER No.2 |
|---|---|---|---|
| #1 | 0 kV | off | off |
| #2 | 0 kV | off | off |
| #3 | 0 kV | off | off |
NUMBER OF IMAGE PICKUP CONDITIONS: 3
FIG. 19A  FIG. 19B  FIG. 19C
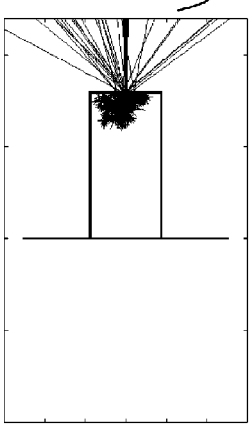
0.8kV
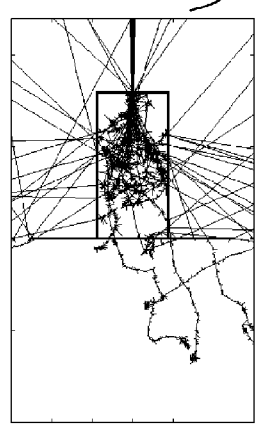
3kV
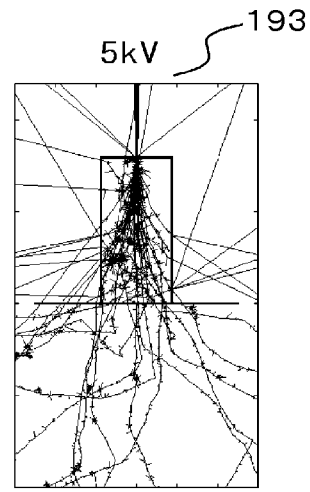
5kV

SHAPE MEASUREMENT METHOD, AND SYSTEM THEREFOR

BACKGROUND

The present invention relates to a shape measurement method and its system for measuring the three-dimensional shape of a pattern of a semiconductor device.

As described in Semiconductor Equipment Association of Japan (SEAJ) "2005 Semiconductor Manufacturing Technology Road Map Reports No. 5 Measurement" (Non Patent Literature 1), a length measuring SEM for measuring critical dimension (CD-SEM), a scanning electron microscope (hereinbelow abbreviated to "SEM") specialized for semiconductor measurement, is most widely used as a pattern dimension management tool in semiconductor process. FIG. 22A shows the principle of a length measuring SEM 2200. An electron beam 2202 emitted from an electron gun 2201 is narrowed with a converging lens 2203, passed through an objective lens 2205 and two-dimensionally scanned on a sample 2206 with a polarizer 2204. Secondary electrons 2207 generated from the sample 2206 with the electron beam irradiation are captured with a detector 2208, and processed inside an image processing unit 2209, thus an electron beam image is obtained. The obtained electron beam image is displayed on a display 2211 of an output unit 2210. Since more secondary electrons 2207 are generated at a pattern edge, the signal level of a part of the electron beam corresponding to the pattern edge is high as indicated with its output waveform signal 2220 in FIG. 22B, and the part corresponding to the pattern edge becomes a bright image. In the length measuring SEM, dimension measurement is performed by obtaining an inter-edge distance 1 as shown in FIG. 22B. Further, the electron gun 2201, the converging lens 2203, the polarizer 2204, the objective lens 2205 and the like are controlled with a control unit 2212.

Various methods have been proposed as a dimension measurement method, however, (a) threshold method and (b) model based measurement method will be described here.

The threshold method is disclosed in Japanese Patent Application Laid-Open Publication No. Sho 55-72807 (Patent Literature 1). In the threshold method, as denoted by numeral 2220 in FIG. 22B, when peak parts with large signal amount corresponding to left and right pattern edges are respectively referred to as a left white band (left WB) and a right white band (right WB), a Max value and a Min value are obtained in the respective left and right WBs, and a threshold level to internally divide these values at a predetermined ratio th (%) is calculated, and a cross position between the threshold and the signal waveform is defined as an edge position.

FIGS. 4A and 4B show the relation between cross-sectional shapes 411, 421 and SEM signal waveforms 412, 422. In the threshold method, as shown in FIGS. 4A and 4B, as the signal waveforms 412 and 422 change in accordance with the cross-sectional shapes 411 and 421, even when the threshold levels are equal, the relations between the detected edge positions and edge positions of the measurement subject pattern are not always equal. For example, in FIG. 4A, an edge point of a tapered edge 413 detected with a threshold level of 50% is inner by 0.5 nm from a bottom edge point, however, that of a vertical edge 423 in FIG. 4B is outer by 2.5 nm. In this manner, the dimension obtained by the threshold method is an inter-edge distance representative value to the end, and it is impossible to know the height to which the measured dimension corresponds.

On the other hand, Japanese Patent Application Laid-Open Publication No. 2009-198339 (Patent Literature 2) discloses, regarding a pattern measuring method based on SEM image utilizing electron beam simulation, high precision pattern measurement by using a simulation image with appropriately-set shape and dimension, having much influence to the accuracy of matching measurement between simulation and real image.

In recent years, strict pattern dimensional management is required in accordance with miniaturization of pattern. There is an increasing need for measurement of subject pattern cross-sectional shape, more particularly, a dimension at a predetermined height (a bottom dimension, a middle dimension, a top dimension or the like) in place of the dimension representative value as described above.

The model based measurement method has been made to respond to this need. FIG. 3 is a principle diagram of the disclosure in J. S. Villarrubia, A. E. Vladar, J. R. Lowney, and M. T. Postek, "Scanning electron microscope analog of scatterometry," Proc. of the SPIE, Vol. 4689, pp. 304-312 (2002) (Non Patent Literature) 2. As shown in FIG. 3, the pattern cross-sectional shape is represented with plural parameters (hereinbelow, "shape parameters". In FIG. 3, a side wall inclination angle and top roundness are shape parameters). SEM signal waveforms of various cross-sectional shapes are obtained by simulation, and a library is created in advance. Upon dimension measurement, the edge shape and edge position of a subject pattern are estimated by selection of a waveform best corresponding with a real waveform in the library and positional shift of the library waveform. When the calculation of SEM signal waveform creation process in the simulation is appropriate and the shape parameters are appropriate, in principle, it is possible to obtain the cross-sectional shape of the subject pattern by the model based measurement method.

SUMMARY

As described above, in the model based measurement method, as a library waveform which most coincides with a real waveform is selected, a cross-sectional shape not included in the library cannot be handled. For example, when a real cross-sectional shape has different side wall inclination angles on the top side and the bottom side while the library includes only a simple trapezoid (the side wall inclination angles on the top side and the bottom side are equal), a correct cross-sectional shape cannot be obtained. In this case, it is necessary to divide the cross-sectional shape into upper and lower trapezoids. To obtain more correct cross-sectional shape, it is advantageous to have a large number of shape parameters.

However, when there are too many shape parameters, another problem may occur. For example, when side wall inclination angle and top roundness as two shape parameters are used, when a pattern dimension is small, in some cases, (a) a signal waveform when the top roundness is large and the side wall inclination angle is small and (b) a signal waveform when the top roundness is small and the wide wall inclination angle is large are approximately equal. In this case, in the model based measurement method, as a library waveform which most coincides with a real waveform is selected, (a) may be the solution or (b) may be the solution by the influence of slight noise. Thus the measurement result is not stable. In this case, to attach importance to the stability, it is necessary to fix the top roundness or the side wall inclination angle sacrificing the "accuracy".

In this manner, in the model based measurement method, the "accuracy" and the "stability" are in trade-off relation, and to fully use the model based measurement method, setting of appropriate shape parameter in correspondence with the purpose of measurement is the problem.

However, in the conventional model based measurement method (Non Patent Literature 2), there is no description about the above-described problem, and accordingly, there is no guideline related to the solution to the problem.

The present invention has an object to provide a support function to set an appropriate shape parameter in the model based measurement method.

Solution to Problem

To address the above-described problem, the present invention provides a shape measurement method including: creating a group of calculated waveforms (library) corresponding to various cross-sectional shapes by electron beam simulation; performing image pickup on a pattern formed on a sample with a scanning electron microscope (SEM); performing matching between a real waveform of an image obtained by the image pickup and the created library and selecting a calculated waveform most coinciding with the real waveform; determining a plurality of shape parameters to represent a cross-sectional shape of the pattern formed on the sample based on the selected calculated waveform; and measuring a three-dimensional shape of the pattern, from an image obtained by performing image pickup on the pattern formed on the sample with the SEM using the determined plurality of shape parameters, wherein the determination of the plurality of shape parameters is performed by supporting setting of shape parameter conditions using the created library, or by checking and determining accuracy of the result of measurement of the three-dimensional shape, or by using both.

Further, to address the above-described problem, the present invention provides a shape measurement system including: a scanning electron microscope (SEM) unit to perform image pickup on a pattern formed on a sample; a library creating unit to create a group of calculated waveforms (library) corresponding to various cross-sectional shapes by electron beam simulation; a model base calculation unit to perform matching between a real waveform of an image obtained by performing image pickup with the SEM unit and the library created with the library creating unit to select a calculated waveform most coinciding to the real waveform; a shape parameter determination unit to determine a plurality of shape parameters to represent a cross-sectional shape of the pattern formed on the sample based on the calculated waveform selected with the model base calculation unit; a three-dimensional shape measurement unit to measure a three-dimensional shape of the pattern from an image obtained by performing image pickup on the pattern formed on the sample with the SEM using the plurality of shape parameters determined with the shape parameter determination unit; and an output unit to output the result of measurement with the three-dimensional shape measurement unit, wherein the shape parameter determination unit determines the plurality of shape parameters by supporting setting of shape parameter conditions using the created library, or by checking and determining accuracy of the result of measurement of the three-dimensional shape, or by using both.

According to an aspect of the present invention, it is possible to, prior to measurement of real pattern, easily set optimum shape parameter conditions.

Further, according to an another aspect of the present invention, it is possible to avoid omission of the necessity of change of conditions, and to obtain a guideline for change.

Further, according to an another aspect of the present invention, by presentation of predicted solution space under various image pickup conditions, it is possible to, prior to measurement of real pattern, select image pickup conditions advantageous to cross-sectional shape measurement.

These features and advantages of the invention will be apparent from the following more particular description of preferred embodiments of the invention illustrated in the accompanying drawings.

BRIEF DESCRIPTION OF THE DRAWINGS

FIG. 5 is a flowchart of library creation for model based measurement.

FIG. 8A is a diagram showing a cross-sectional shape of a pattern representing a nominal shape; FIG. 8B, a table to input a nominal value; FIG. 8C, a table to input a noise level; FIG. 8D, a signal waveform selected from a library; and FIG. 8E, a noise-added signal waveform.

FIG. 16 is a flowchart showing the processing flow of accuracy determination.

FIG. 18 is a GUI to input image pickup conditions.

FIG. 19A is a cross-sectional diagram of a sample showing the result of simulation of internal diffusion of electrons when accelerating voltage is 0.8 kV; FIG. 19B, a cross-sectional diagram of the sample showing the result of simulation of internal diffusion of electrons when the accelerating voltage is 3 kV; FIG. 19C, a cross-sectional diagram of the sample showing the result of simulation of internal diffusion of electrons when the accelerating voltage is 5 kV.

DESCRIPTION OF THE PREFERRED EMBODIMENTS

A shape measurement method and its system according to the present invention provides the following functions (1) to (3).

(1) Shape Parameter Conditions Setting Support Function

The present function is, prior to measurement of real pattern, presenting solution space under set shape parameter conditions (hereinbelow, "expected solution space") using a library for model based measurement. More particularly, one waveform corresponding to a predetermined shape parameter value is taken from the library, then matching is performed between this waveform and library member waveforms (respective member waveforms are linked to unique shape parameter value). Thus evaluation values representing waveform coincidence degree in respective combinations are obtained. The result of plotting of the relation between the shape parameter values and the evaluation values is presented.

(2) Function of Confirming Accuracy of Measurement Result

The present function is, after the measurement of real pattern, presenting solution space under the set shape parameter conditions (hereinbelow, "real solution space") using real waveform and library for model based measurement. Further, it is a function of displaying superimposed real waveform, library waveform and cross-sectional shape as a measurement result for a location specified on the solution space. More particularly, matching is performed between the real waveform and library member waveforms (the respective waveforms are linked to unique shape parameter) to obtain evaluation values representing waveform coincidence degree in the respective combinations. Then the result of plotting the relation between the shape parameter values and the evaluation values is presented.

(3) Function of Predicting Image Pickup Conditions Appropriate to Measurement of Cross-Sectional Shape The present function is previously creating libraries under various image pickup conditions (various accelerating voltages, various energy filter conditions and the like), and presenting the result of acquisition of the above-described predicted solution space by library.

Figure 2:
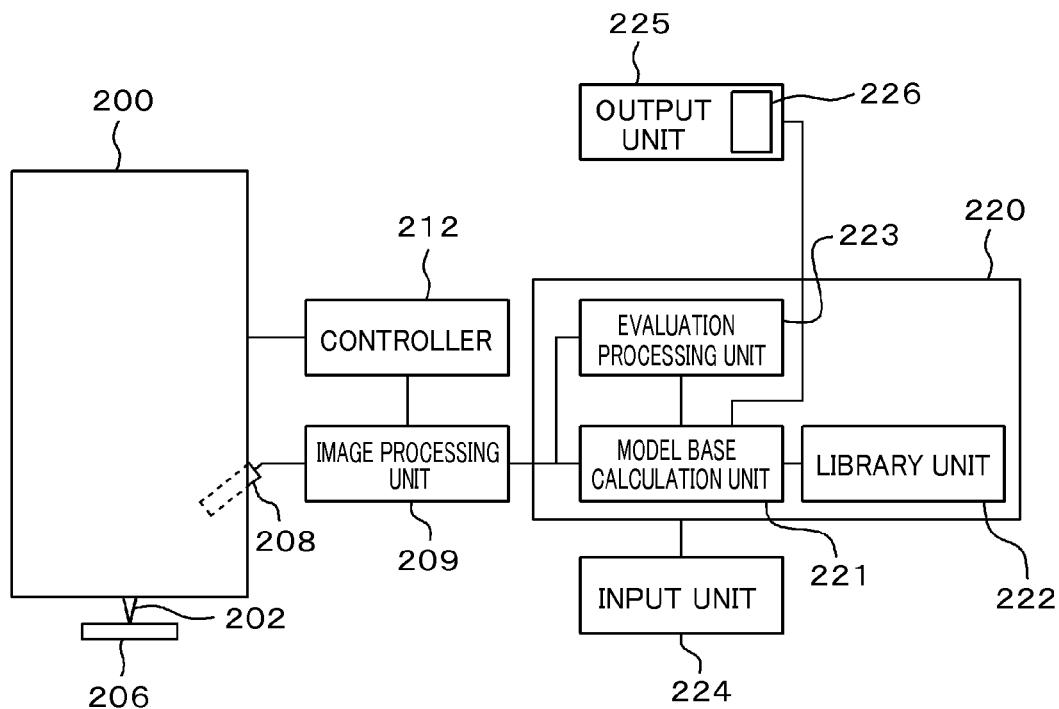
FIG. 2 is a block diagram showing a configuration of a length measuring SEM according to an embodiment of the present invention.
Figure 3:
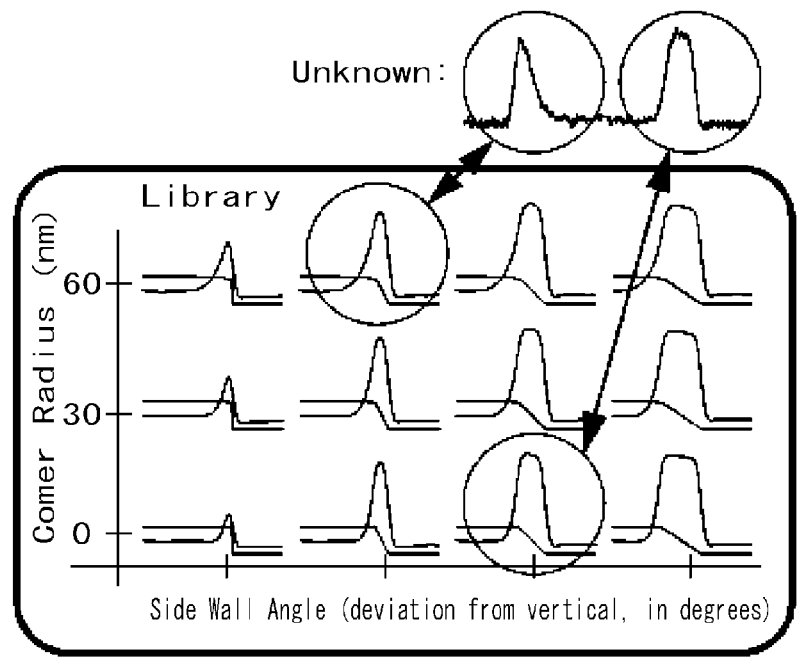
FIG. 3 is a diagram explaining the principle of model based measurement as a conventional technique.
Figure 4A:
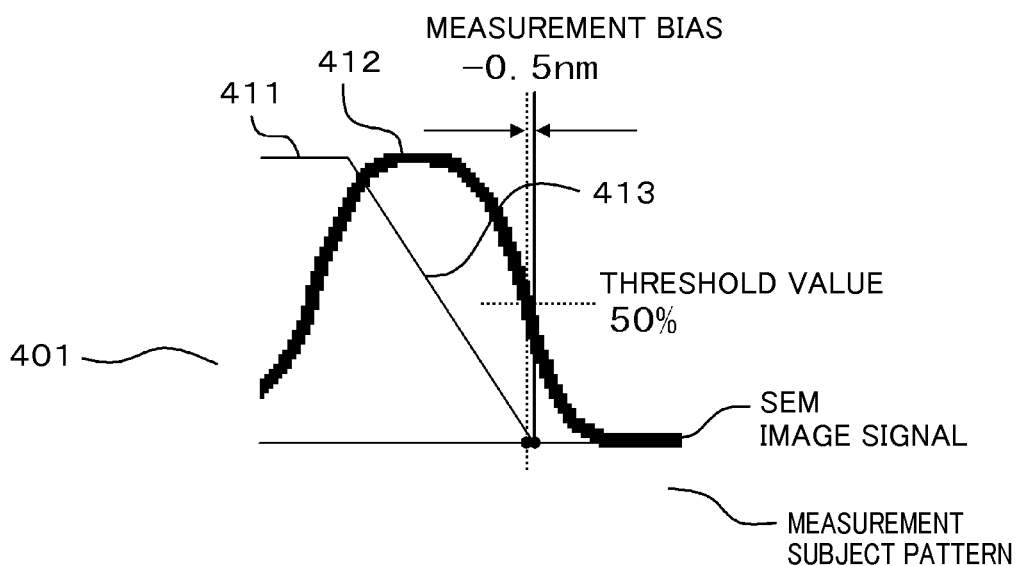
FIG. 4A is a diagram explaining the relation between SEM signal waveform and a cross-sectional shape having a tapered edge.
Figure 4B:
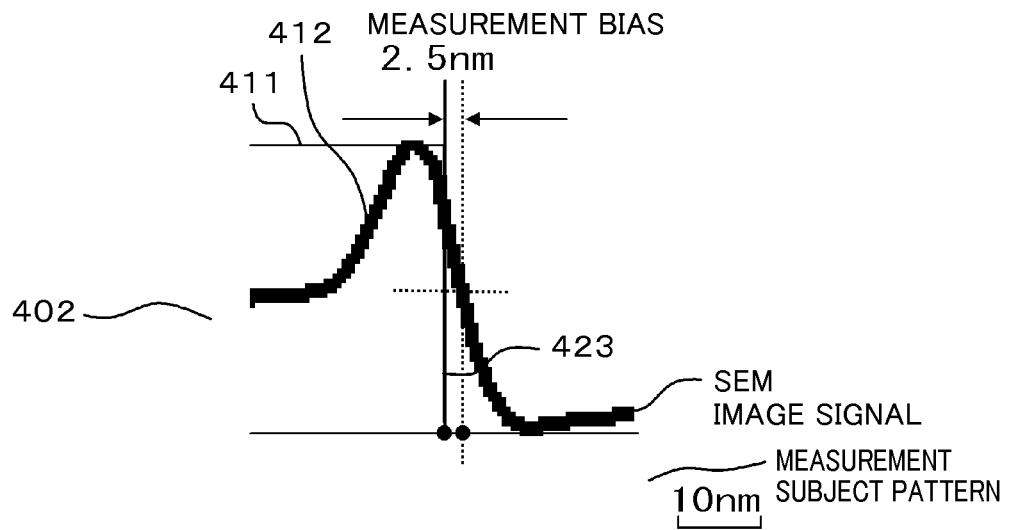
FIG. 4B is a diagram explaining the relation between SEM signal waveform and a cross-sectional shape having a vertical edge.

First, the configuration of the system for measurement of three-dimensional shape according to the present embodiment will be described using FIG. 2.

Figure 22A:
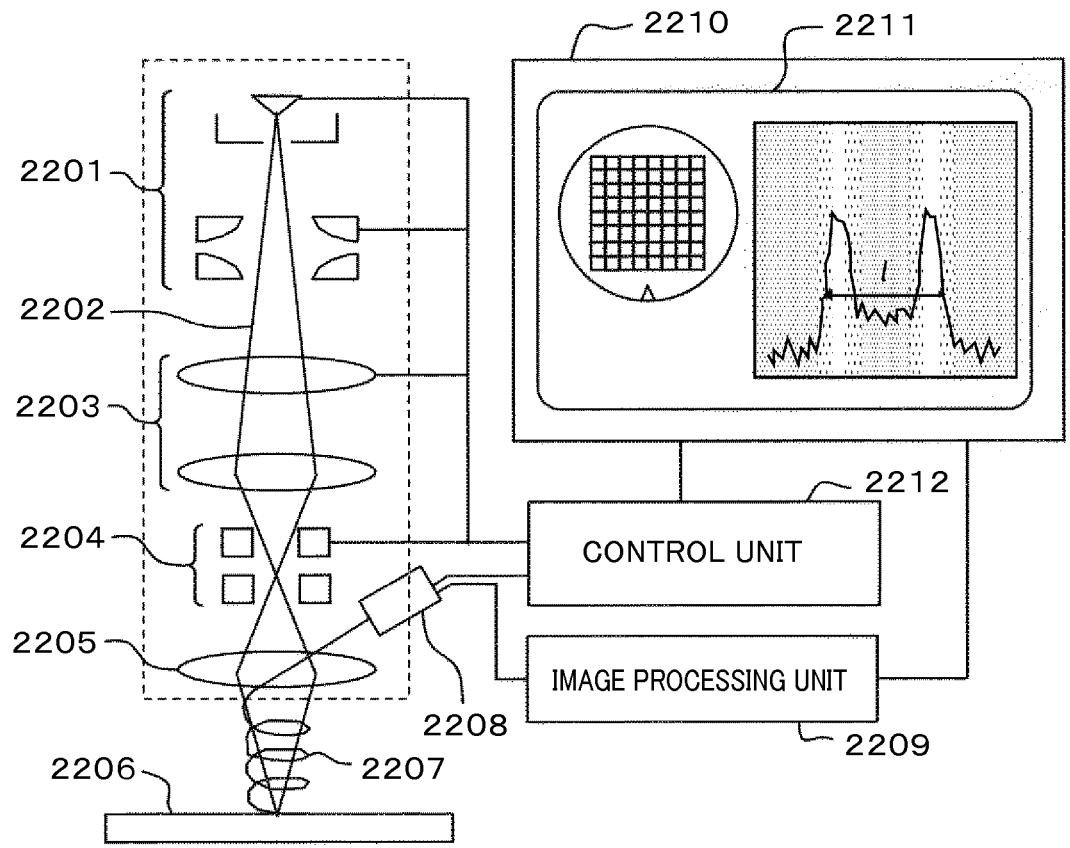
FIG. 22A is a block diagram showing the configuration of a conventional length measuring SEM.
Figure 22B:
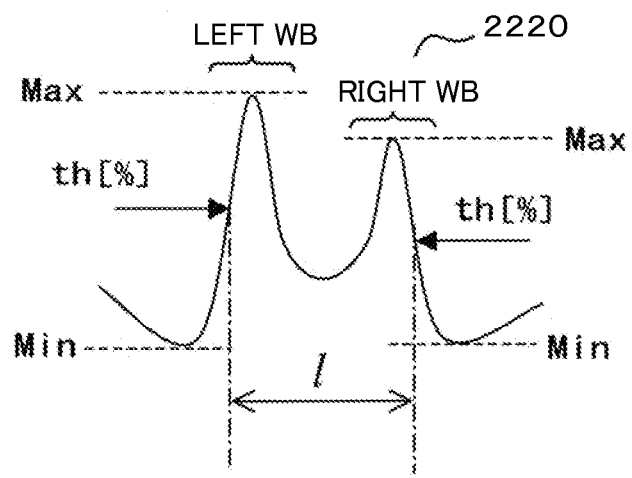
FIG. 22B, a diagram showing an output waveform signal of the length measuring SEM.

A system for measuring a three-dimensional shape according to the present embodiment has an SEM 200, an image processing unit 209 to receive an output signal from a detector 208 of the SEM 200 which has detected secondary electrons generated from a sample 206 by emission of an electron beam 202 on the sample 206 with the SEM 200, and to generate an SEM image, an entire controller 212, a model base calculation processing unit 220, an input unit 224, and an output unit 225 having a display screen 226. Among these elements, as the configuration of the SEM 200, the image processing unit 209 which receives the output signal from the detector 208 of the SEM 200 and the entire controller 212 are the same as those described in the background of the present specification using FIG. 22A, the explanation thereof will be omitted.

The model base calculation processor 220 has a model base calculation unit 221, a library unit 222 and an evaluation processing unit 223.

Hereinbelow, the embodiment to realize the above-described respective functions will be described using the drawings.

(1) Shape Parameter Conditions Setting Support Function

Figure 1:
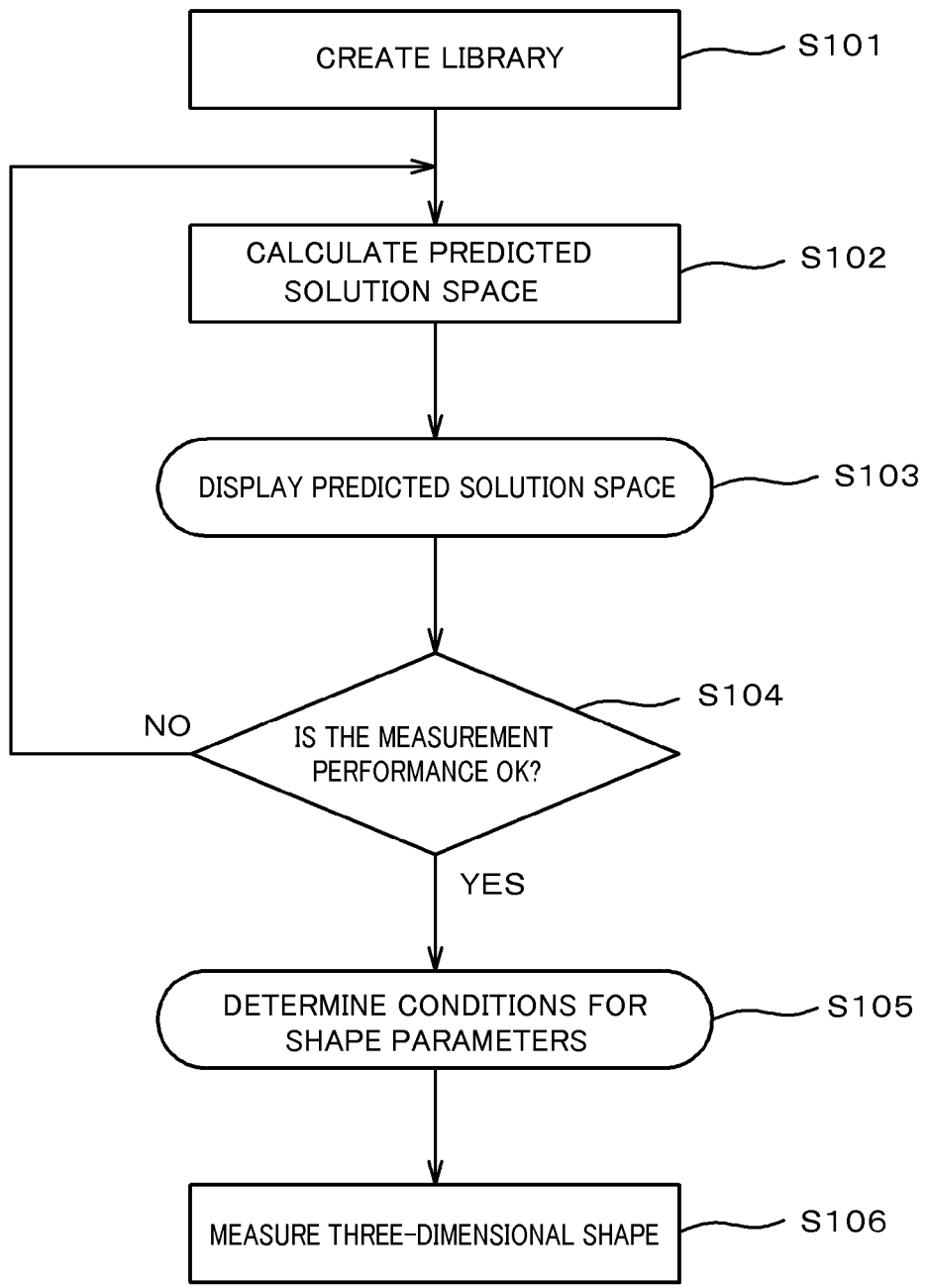
FIG. 1 is a flowchart showing an entire processing flow of three-dimensional shape measurement processing using a support function for setting shape parameter conditions.

The present function relates to processing to determine shape parameter conditions. FIG. 1 shows the entire flow of the processing to determine shape parameter conditions.

In the present processing flow, first, the library unit 222 creates a library (S101), then the model base calculation unit 221 calculates expected solution space using the created library (S102), and the calculated expected solution space is displayed on the display screen 226 of the output unit 225 (S103). It is checked whether or not the measurement performance is OK (S104). When it is determined that the measurement performance is OK, the parameter conditions are determined (S105). Then using the determined shape parameter conditions, the three-dimensional shape of a pattern formed on the sample 206 using an SEM image obtained by image pickup with the SEM 200 on the sample 206 is measured with the evaluation processing unit 223 (S106).

Hereinbelow, the respective steps, the creation of library (S101), the calculation of expected solution space (S102), the display of expected solution space (S103) and the determination as to whether or not the measurement performance has a problem (S104), will be described in detail.

First, the step of library creation (S101) will be described. As described above, in the model based measurement method, the cross-sectional shape as a measurement subject is represented with plural shape parameters, and signal waveforms corresponding to the cross-sectional shape are calculated by SEM simulation (Monte Carlo simulation or the like) and stored as a waveform library.

Figures 6A, 6B, 6C:
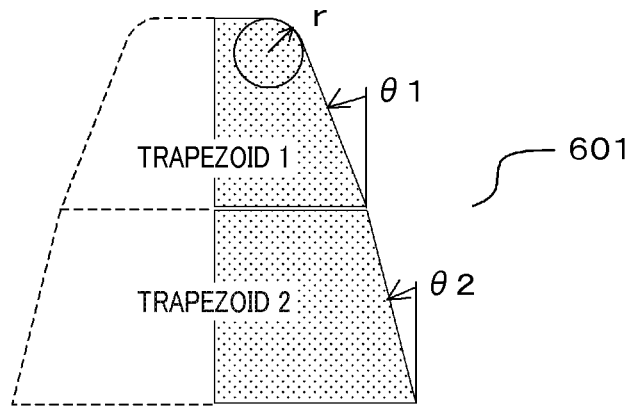
FIG. 6A is a schematic diagram of a pattern cross-sectional shape as a premise of library creation.
FIG. 6B, a table to select a shape parameter representing a cross-sectional shape.
FIG. 6C, a table to input range and pitch of each shape parameter.

FIG. 5 shows the flow of library creation, and FIGS. 6A to 6C show related input items. First, the method of representation of cross-sectional shape, i.e., a shape parameter to represent the cross-sectional shape is determined (S501, and 602 in FIG. 6B). In this example, as shown in 601 in FIG. 6A, the cross-sectional shape is represented as a two-step trapezoid having a round top. As the method of representation of cross-sectional shape, it is desirably representation not so different from an actual cross-sectional shape based on the result of observation of cross-section using an SEM or the result of measurement with an atomic force microscope (AFM). Next, the range and pitch of each parameter (in the example of FIG. 6C, the top roundness (r), an upper side wall inclination angle ($\theta1$), a lower side wall inclination angle ($\theta2$) are inputted (S502, and 603 in FIG. 6C). It is necessary for the variation range of shape parameter to cover the change range of a measurement subject shape. Based on the above input information, the signal waveforms corresponding to the respective cross-sectional shapes are calculated by SEM simulation (S503).

Figure 7:
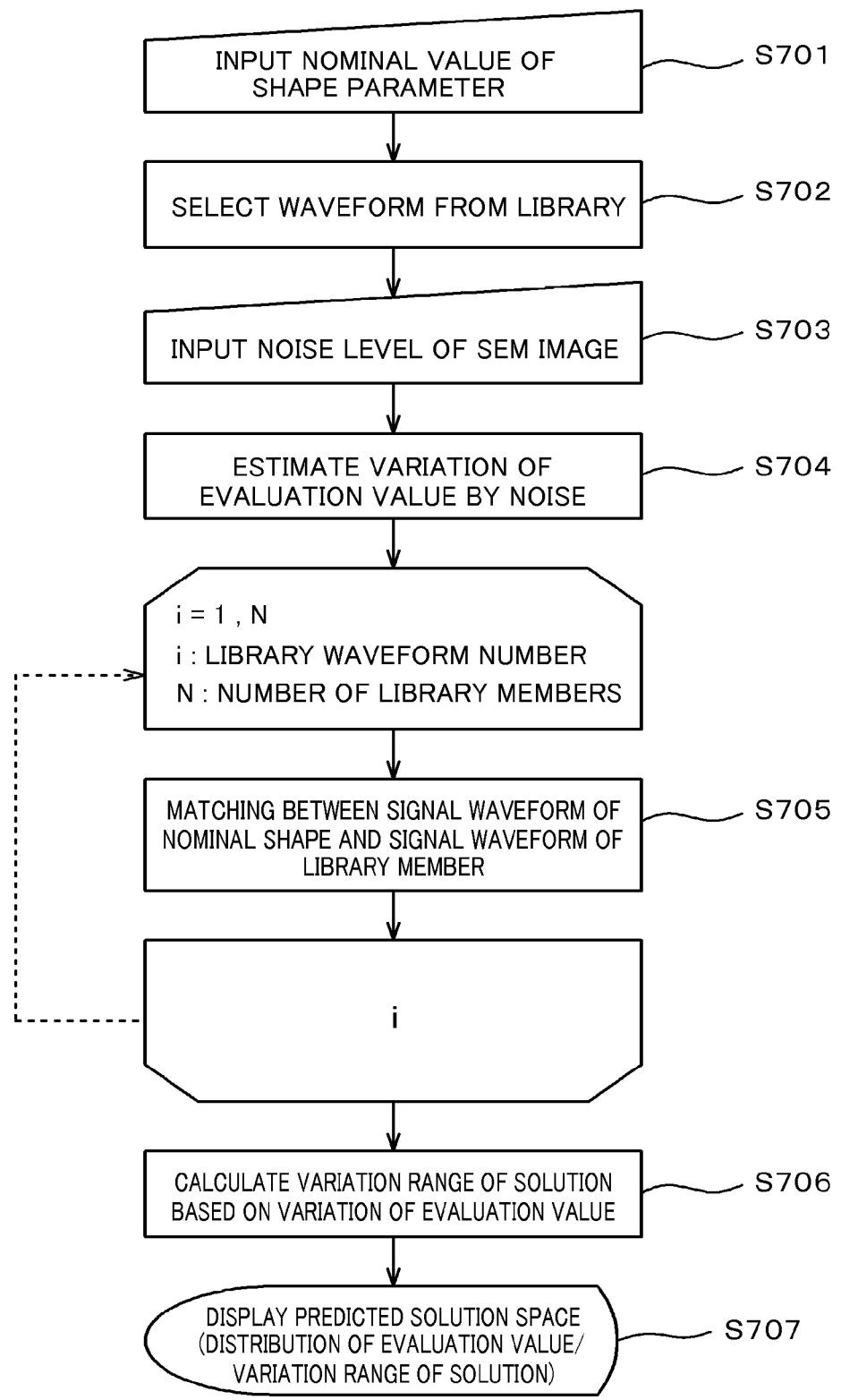
FIG. 7 is a flowchart showing the flow of predicted solution space calculation.

Next, the calculation of expected solution space (S102) will be described. FIG. 7 shows the flow of the calculation of expected solution space, and FIGS. 8A to 8E show related input items and display items. First, the nominal value of the shape parameter is inputted (S701, and 802 in FIG. 8B). Note that in FIG. 6A, the cross-sectional shape is represented with a two steps of trapezoid having a round top, however, for the sake of simplification of explanation, it is one step trapezoid having a round top here (801). Next, a signal waveform for a shape parameter corresponding to the input nominal value is selected from the library (S702). Next, a noise level to be added to the signal waveform as percentage is inputted (S703, and 803 in FIG. 8C). To visually check the change of waveform by noise, the signal waveform before addition of noise (804 in FIG. 8D) and the signal waveform after the addition of noise (805 in FIG. 8E) are displayed. It is desirable that the noise level is set to about the same level of a real signal waveform by referring to the SEM image.

Figure 9:
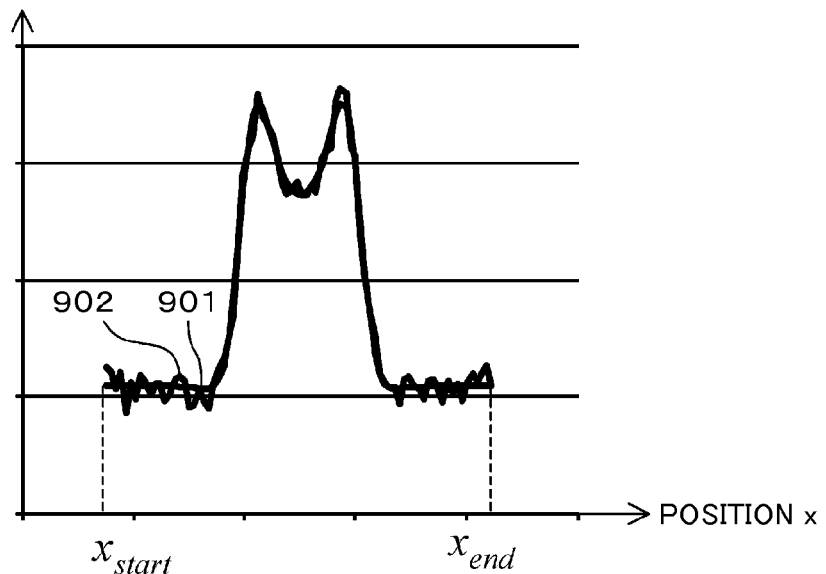
FIG. 9 is a graph showing superimposed signal waveform without noise and noise-added signal waveform.

Next, as shown in FIG. 9, a signal waveform 901 without noise and a noise-added signal waveform 902 are superimposed, and it is estimated to which extent an evaluation value indicating the degree of coincidence between these signal waveforms varies (S704). As the evaluation value, e.g., a chi-square value shown in (Expression 1) is used.

$$\chi^2 = \frac{\sum_{x=x_{start}}^{x_{end}} [I(x) - I_{Model}(x)]^2}{x_{end} - x_{start}} \quad \text{(Expression 1)}$$

The chi-square value becomes smaller as the both waveforms coincide with each other. Note that as other evaluation value than the chi-square value, a correlation value, a phase-limited correlation value or the like is applicable.

At S704, more particularly, noise generation using a random number is performed plural times (e.g., about 30 times), then the variation of the chi-square value is obtained. Next, matching is performed between the signal waveform of the nominal shape (signal waveform selected at S702) and the library member waveforms (S705), to calculate the chi-square values in the respective combinations. Based on the variation of the qui-square value previously obtained at S704, the range of variation of the measurement value of the respective shape parameters are calculated (S706), and displayed together with the distribution of the chi-square value (S707).

Figure 10:
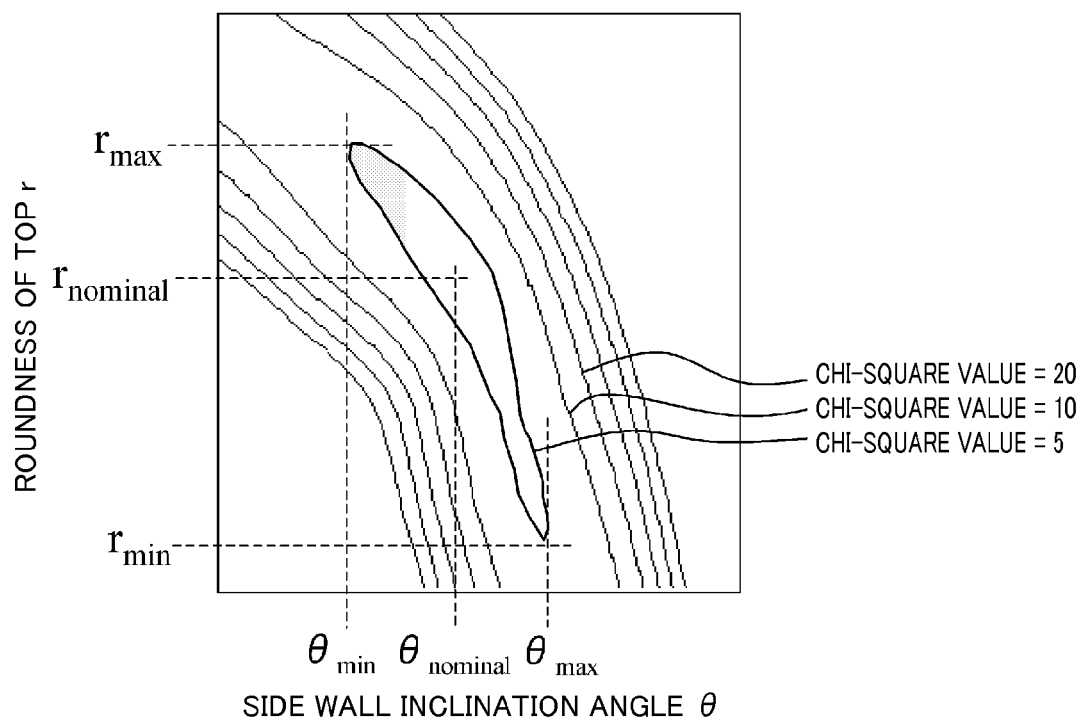
FIG. 10 is a graph showing predicted solution space.

FIG. 10 shows an example of the expected solution space. The horizontal axis indicates the side wall inclination angle, and the vertical axis, the top roundness. The chi-square value is indicated with a contour line. Assuming that the variation of the chi-square value obtained at S704 is 5, a long slender region is a possible range of variation of the result of measurement of cross-sectional shape by model based measurement. The stability of the measurement is high when this region is narrow. In the figure, $r_{min}$ to $r_{max}$ is a possible range of the variation of the top roundness, and $\theta_{min}$ to $\theta_{max}$, a possible range of variation of the side wall inclination angle.

Note that when the number of shape parameters to be varied is two, as shown in FIG. 10, one shape is represented using the axis x while the other shape is represented using the axis y, and the chi-square value is represented with the contour line. As shown in FIG. 6, when the number of shape parameters to be varied is three (top roundness, upper side wall inclination angle and lower side wall inclination angle), three types of expected solution spaces where one of the shape parameters is fixed are presented as shown in FIGS. 11A to 11C.

Figure 11A:
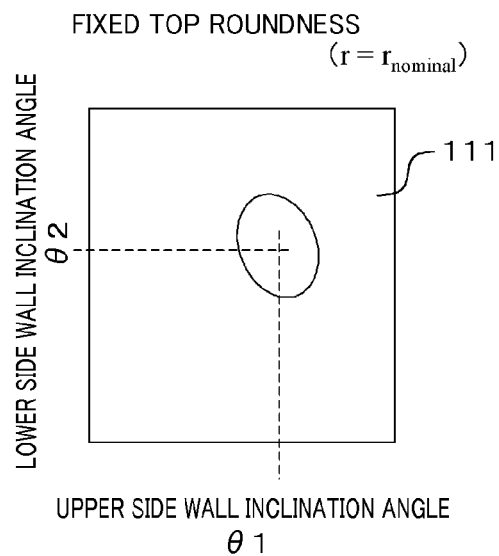
FIG. 11A is a graph of predicted solution space obtained with fixed top roundness.
Figure 11B:
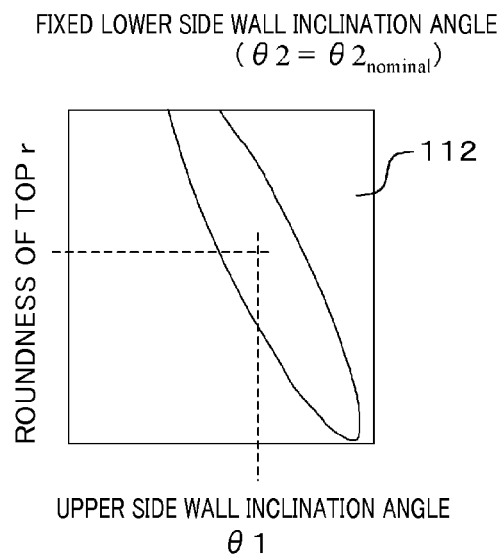
FIG. 11B, a graph of the predicted solution space obtained with fixed lower side wall inclination angle.
Figure 11C:
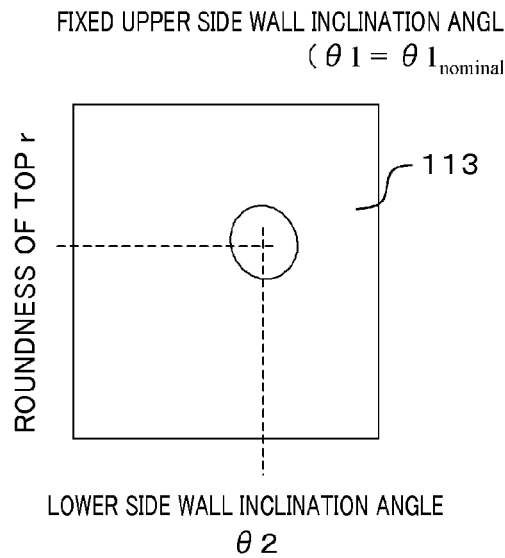
FIG. 11C, a graph of the predicted solution space obtained with fixed upper side wall inclination angle.

In FIG. 11A, 111 shows expected solution space with a fixed top roundness; in FIG. 11B, 112 shows expected solution space with a fixed lower side wall inclination angle; and in FIG. 11C, 113 shows expected solution space with a fixed upper side wall inclination angle. Note that FIGS. 11A to 11C only show a region corresponding to the region in FIG. 10 where the chi-square value is equal to or less than 5.

As the expected solution spaces as shown in FIGS. 10, 11A to 11C are presented, it is possible to determine whether or not the shape parameter conditions are appropriate. For example, in FIG. 11B, it is understood from the expected solution space 112 that the variation range of the both top roundness and upper side wall inclination angle are wide and that the solution is not stable when these are variable parameters. On the other hand, in FIG. 11A, the expected solution space 111 is localized, and the upper side wall inclination angle and the lower side wall inclination angle are independent to each other. It is understood that even when both of them are used as variable parameters, the solution is not unstable. The same is in the case of expected solution space 113 in FIG. 11C. In this case, it is understood as a guideline that to obtain stable solution, it is effective to fix the top roundness.

On the other hand, when the result that the solution is not unstable even though all the shape parameters are varied is obtained, it is understood as a guideline that there is a possibility to increase the shape parameters to be varied. In this case, it may be arranged such that the shape parameters to be varied are increased, and again, expected solution space is obtained and checked.

According to the present embodiment, it is possible to, prior to measurement of real pattern, set optimum shape parameter conditions (conditions such that the number of shape parameters to be varied which is not too large or too small). With these parameters, it is possible to realize model based measurement with higher precision.

As described above, it is possible to instantly grasp the distribution of high-coincidence region by presentation of expected solution space with the shape parameter conditions setting support function. Accordingly, it is possible to easily determine whether or not the set shape parameter conditions are appropriate. For example, when there is a wide spread of high-coincidence region or an enclave of high-coincidence region, it is understood that the number of shape parameters is too large and it is not possible to perform measurement with high stability. Further, since it is possible to grasp a shape parameter which expands the high-coincidence region, it is possible to effectively determine a shape parameter to be fixed. When the expected solution space is presented again after the change of shape parameter conditions, it is possible to check the effect. On the other hand, when the high-coincidence region is sufficiently narrow, it is understood that there is a possibility to increase the number of shape parameters. When the number of shape parameters is increased and the expected solution space is presented again, it is possible to determine whether or not the degradation of the stability of measurement by increment of the number of shape parameters is within an allowable range.

(2) Function of Confirming Accuracy of Measurement Result

The function of confirming the accuracy of measurement result will be described. The shape parameter conditions setting support function described in (1) is to provide a function of supporting setting conditions for shape parameters applied to measurement of real pattern prior to measurement of real pattern. On the other hand, the present function provides a function of judging to confirm the accuracy of measurement result after measurement of real pattern.

As the function of judging to confirm the accuracy of measurement result, real solution space is calculated and presented using real waveforms, and for the sake of the above-described judgment, solution space as a comparative subject (hereinbelow, "reference solution space") is calculated and also presented.

Figure 12:
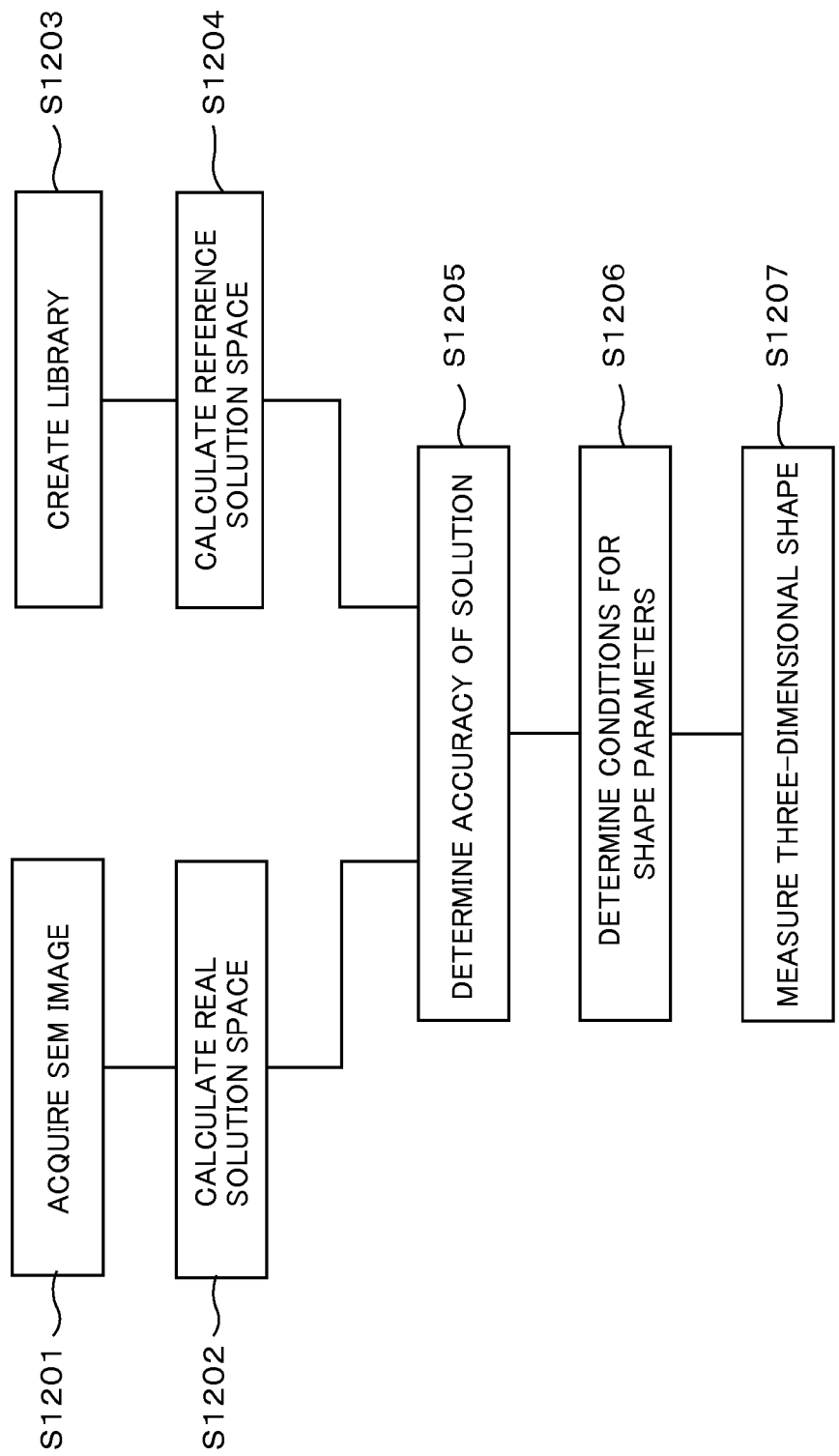
FIG. 12 is a flowchart showing the entire processing flow of three-dimensional shape measurement processing using a measurement result accuracy checking function.

FIG. 12 shows the entire processing flow of the function of judging to confirm the accuracy of measurement result. First, the SEM 200 performs image pickup on the sample 206 to obtain an SEM image (S1201), and obtains real solution space from the SEM image (S1202). On the other hand, the library unit 222 creates a library (S1203), and obtains reference solution space using the created library (S1204). Next, the evaluation processing unit compares the real solution space with the reference solution space and judging the accuracy of the solution (S1205), to determine conditions for shape parameters (S1206). Using the determined conditions for shape parameters, three-dimensional measurement is performed on the pattern shape of the sample 206 subjected to image pickup with the SEM (S1207).

Figure 13:
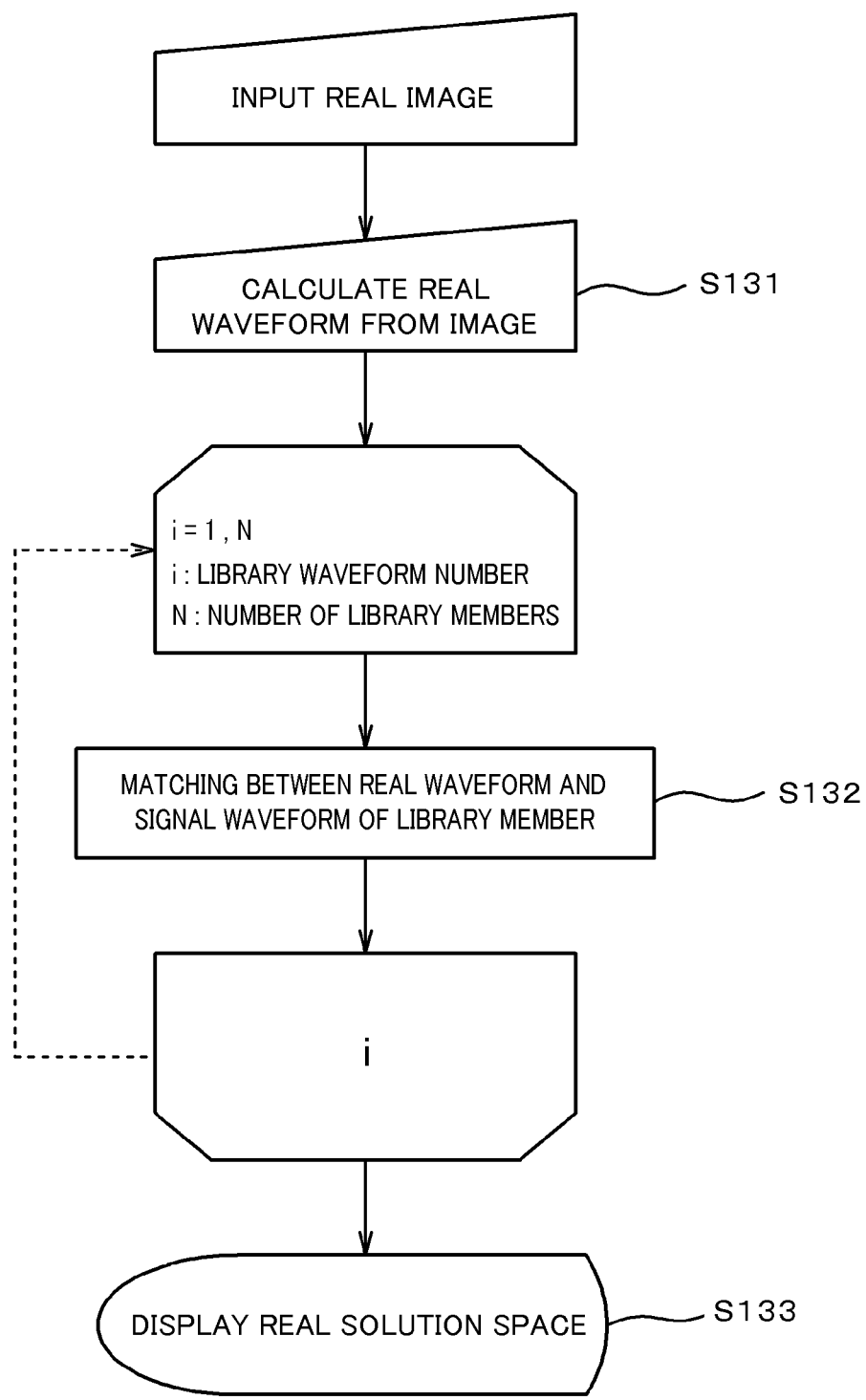
FIG. 13 is a flowchart showing the processing flow of real solution space calculation.

FIG. 13 shows the flow of calculation of the real solution space at S1202. First, the SEM 200 performs image pickup on the sample 206 and obtains a waveform from a real image generated with the image processing unit 209 (S131). The model base calculation unit 221 performs matching between this waveform and library member waveforms registered in the library unit 222. The evaluation processing unit 223 calculates matching evaluation values in the respective combinations (S132). The calculated values are displayed on the display screen 226 of the output unit 225 (S133). As the matching evaluation value, e.g., a chi-square value as shown in FIG. 9 is used.

Figure 14:
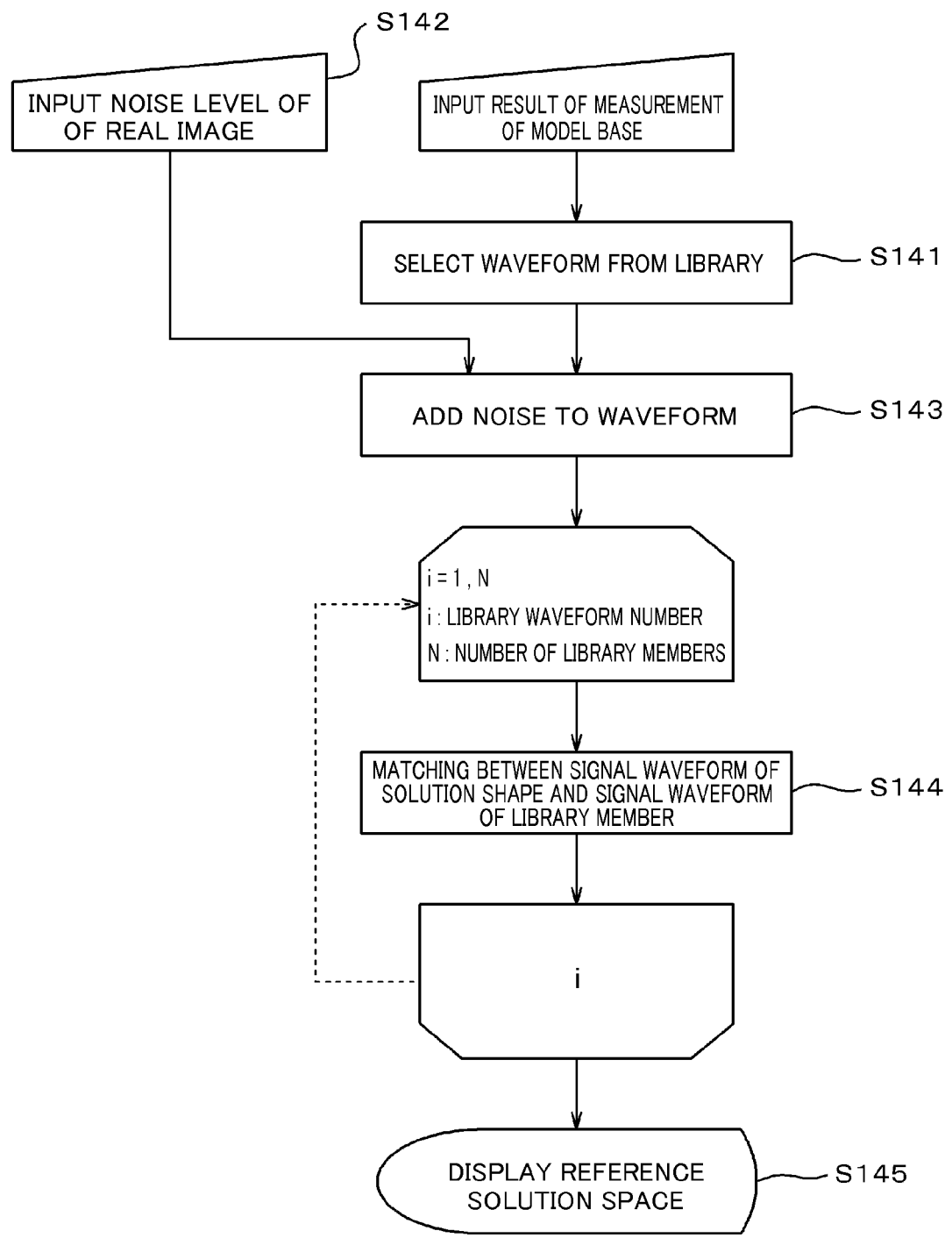
FIG. 14 is a flowchart showing the processing flow of reference solution space calculation.

FIG. 14 shows the flow of calculating the reference solution space at S1204. A library waveform corresponding to a cross-sectional shape outputted as a result of model based measurement is selected from the library (S141). Noise equivalent to the real waveform obtained at S131 in FIG. 13 is added to the selected waveform (S143). Next, matching is performed between the waveform to which the noise has been added at S143 and the library member waveform, and the evaluation values in the respective combinations are calculated (S144), and displayed as the reference solution space (S145). As the matching evaluation value, e.g., a chi-square value as shown in FIG. 9 is used.

Figure 15A:
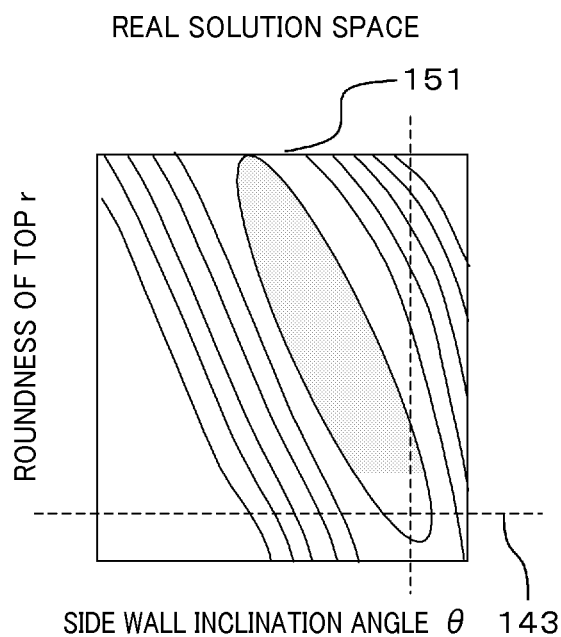
FIG. 15A is a graph showing the real solution space.
Figure 15B:
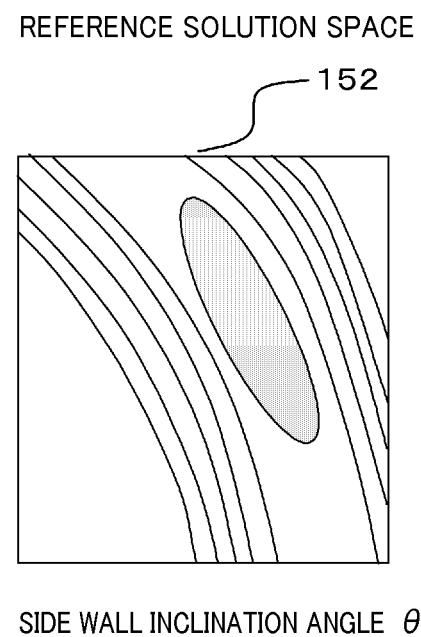
FIG. 15B, a graph showing the reference solution space.
Figure 15C:
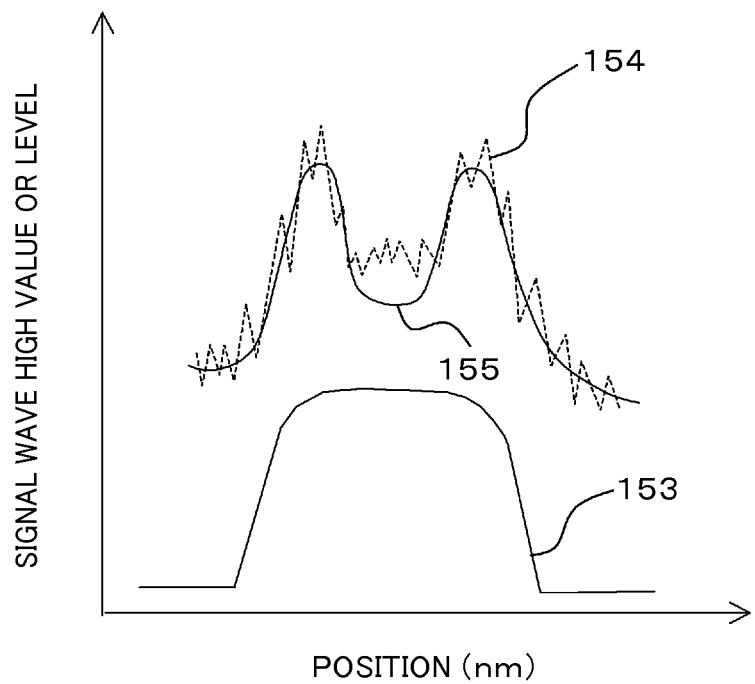
FIG. 15C, a graph showing superimposed real waveform and library waveform and further showing a cross-sectional shape.

To compare the real solution space with the reference solution space, it is desirable to display them together on the screen 226 of the output display unit 225 as shown in FIGS. 15A to 15C. In FIG. 15B, reference solution space 152 is, so to speak, solution space which is obtained when model based measurement is performed under ideal conditions. Accordingly, when the difference between the real solution space 151 in FIG. 15A and the reference solution space 152 in FIG. 15B is small, it is judged that model based measurement has been performed as expected. When the alienation is large, it is judged that model based measurement has not been performed as expected.

FIG. 16 shows an example of specific flow at S1205. First, minimum values of the both solution spaces are compared (S161). When a chi-square vale is used as an evaluation value, the chi-square value of the real solution space is often greater than the chi-square value of the reference solution space (generally, the coincidence between a real waveform and a library waveform is lower than the coincidence between library waveforms). Accordingly, for example, when the chi-square value of the real solution space is several times greater than that of the reference solution space, it is determined that the accuracy of the result of model based measurement is low, and the processing is terminated (S162). On the other hand, when the difference between the evaluation values is within a supposed range, the shapes of the contour-surrounded regions and the intervals between the contour lines are compared (S163). For example, when the size of the contour-surrounded region of the real solution space is several times greater than that of the reference solution space, it is determined that the accuracy of model based measurement is low, and the processing is terminated (S164). It is determined, passed through these judgments, that the accuracy of measurement result is high (S165).

In case that the measurement result is determined not correct (S162 and S164), it means that the cross-sectional shape of the real pattern is not correctly represented under the set shape parameter conditions. In the present embodiment, as a support function for efficient change of shape parameter conditions, the real waveform, the library waveform and the cross-sectional shape as the solution of model based measurement are superimposed and displayed on the screen 226. In the real solution space 151 in FIG. 15A, a cursor 153 as crossed vertical and horizontal lines is placed in desired coordinates then a predetermined button (not shown) is clicked, a real waveform 154, a library waveform 155 and a cross-sectional shape 153, in superimposed status, are displayed as shown in FIG. 15C. With this display, it is possible to determine a part of the cross-sectional shape corresponding to the match/mismatch between the real waveform and the library waveform. With the result displayed on the display, it is possible to obtain a guideline for changing the fixed value of the shape parameter or fixing another shape parameter.

According to the above-described function to confirm the certainty of measurement result, as the certainty of measurement result is indicated, it is possible to avoid overlook of the necessity of review of the shape parameter conditions. Further, as the guideline as to how change the shape parameter conditions is displayed, it is possible to efficiently change the shape parameters. Further, with these arrangements, it is possible to realize model based measurement with higher precision.

As described above, as real solution space is displayed with the function of confirming the certainty of measurement result, it is possible to instantly grasp the distribution of high-coincidence region. Accordingly, it is possible to easily judge the degree of certainty of the result of model based measurement. For example, by checking whether or not the spread of high-coincidence region is equivalent to the above-described expected solution space, it is determined whether or not the measurement result has accuracy as expected. When it is different from the expected solution space, it is understood that the cross-sectional shape of the real pattern cannot be correctly represented under the set shape parameter conditions and the certainty of measurement result is low.

Further, as the real waveform, the library waveform and the cross-sectional shape as a measurement result are superimposed and displayed, it is possible to determine a part of the cross-sectional shape corresponding to the match/mismatch between the real waveform and the library waveform. With the result displayed on the display, it is possible to efficiently change conditions for changing a fixed value of the shape parameter or fixing another shape parameter.

Since it is conventionally impossible to indicate the accuracy of measurement result, it is impossible to even notice the necessity of change of conditions. However, according to the present embodiment, it is possible to avoid overlooking the necessity of change of conditions, and to obtain a guideline for change.

(3) Function of Predicting Image Pickup Conditions Appropriate to Measurement of Cross-Sectional Shape Next, the function of predicting image pickup conditions appropriate to measurement of cross-sectional shape will be described. This function of predicting image pickup conditions appropriate to measurement of cross-sectional shape is, prior to measurement of real pattern, applying the method of shape parameter conditions setting support explained in (1) to plural imaging conditions and predicting image pickup conditions advantageous to model based measurement.

Figure 17:
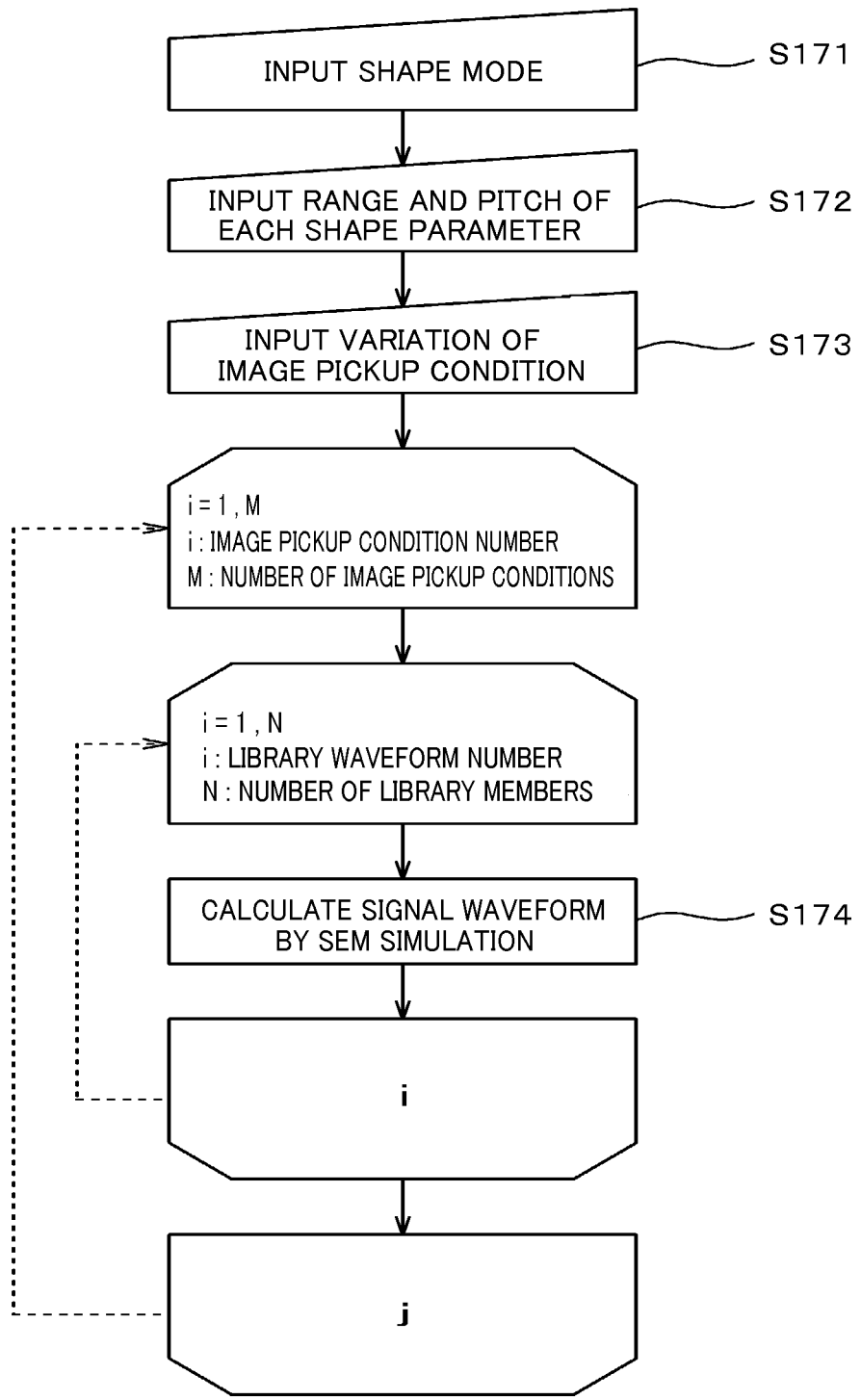
FIG. 17 is a flowchart showing the processing flow of prediction of image pickup conditions appropriate to cross-sectional shape measurement.

FIG. 17 shows the entire flow of the function of predicting image pickup conditions appropriate to measurement of cross-sectional shape. The input of shape model (S171) and the input of range and pitch of each shape parameter (S172) are the same as those in the case of (1). In the present function, variation of image pickup conditions is inputted (S173), and a signal waveform is calculated by SEM simulation (S174). FIG. 18 shows an example of a GUI 1800 for input of variation of image pickup conditions. On the GUI 1800, a number of image pickup conditions 1801 and variation of image pickup conditions are inputted. The variation of image pickup conditions desirably covers the variation of image pickup conditions of an image pickup device (CD-SEM) to be used such as accelerating voltage variation 1801, energy filter (1) presence/absence 1802 and energy filter (2) presence/absence 1803.

Figure 19D:
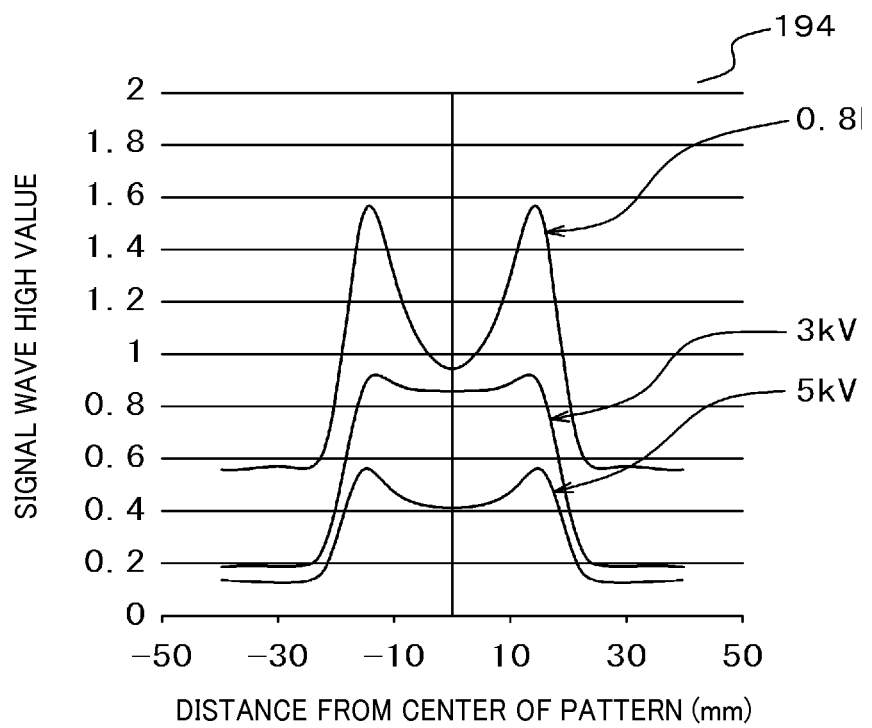
FIG. 19D, a graph showing signal waveforms at respective accelerating voltages obtained by simulation.

FIGS. 19A to 19C are diagrams explaining change of signal waveform in accordance with different accelerating voltages. In FIG. 19A, 191 shows the result of simulation of internal electron diffusion when the accelerating voltage is 0.8 kV; FIG. 19B, 192 shows the result of simulation when the accelerating voltage is 3 kV; and FIG. 19C, 193 shows the result of simulation when the accelerating voltage is 5 kV. It is understood that in accordance with increment of accelerating voltage, the incoming depth of the primary electrons is deeper, and the internal diffusion spreads in a wider range. In FIG. 19D, 194 shows signal waveforms at respective accelerating voltages also obtained by simulation. As a result of difference in internal diffusion, the signal waveforms are different.

Figure 20A:
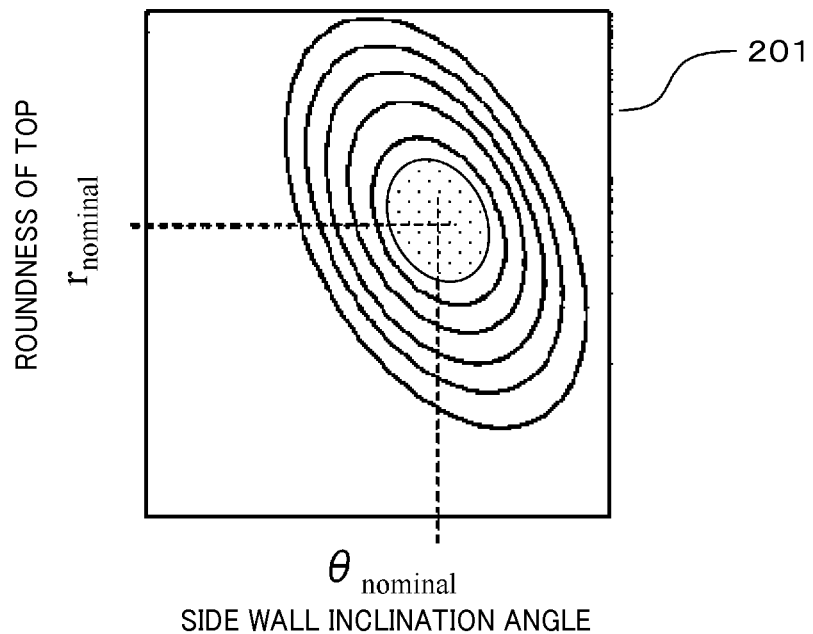
FIG. 20A is a graph showing the predicted solution space when the accelerating voltage is 0.8 kV.
Figure 20B:
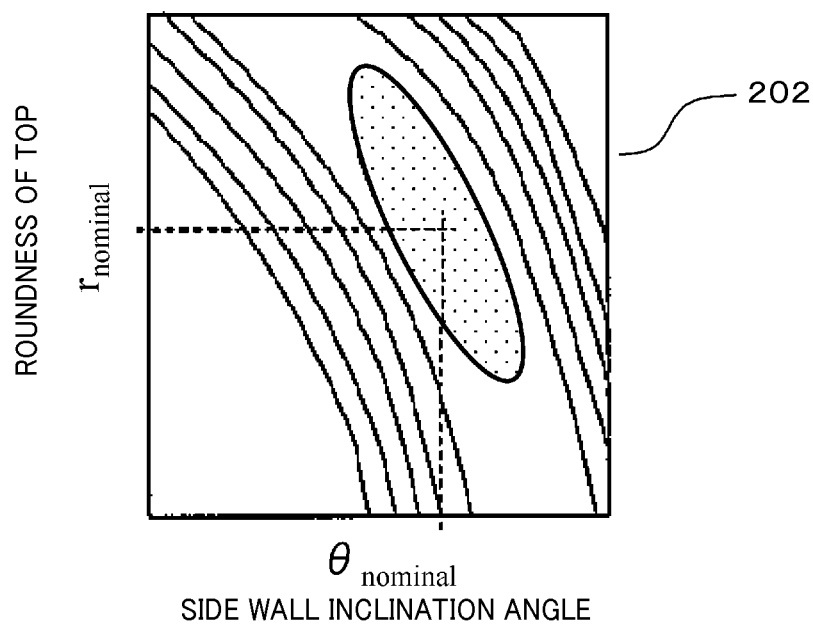
FIG. 20B, a graph showing the predicted solution space when the accelerating voltage is 3 kV.

In the present function, the expected solution space (FIG. 10) indicated in (1) is obtained by the image pickup condition and is presented. The difference in accelerating voltage causes difference in expected solution space as shown in FIG. 19. Assuming that 201 in FIG. 20A shows expected solution space when the accelerating voltage is 0.8 kV and 202 in FIG. 20B shows expected solution space when the accelerating voltage is 3 kV, it is understood that measurement with higher stability can be realized with 201 in FIG. 20A where the possible range of diffusion of result of measurement of cross-sectional shape by model based measurement (gray region) is narrower. The image pickup conditions for real pattern measurement may be determined based on this result.

According to the present function, it is possible to, prior to measurement of real pattern, predict image pickup conditions more advantageous to model based measurement on a computer. With this arrangement, as the process of determining image pickup conditions in a trial and error manner using an actual sample is not necessary, the efficiency is improved. As a result, it is possible to realize model based measurement with higher precision.

The measurement system may be provided with all the respective functions explained in the above-described (1) to (3) or the combination of any two of them. Otherwise, only one of them is employed.

Figure 21:
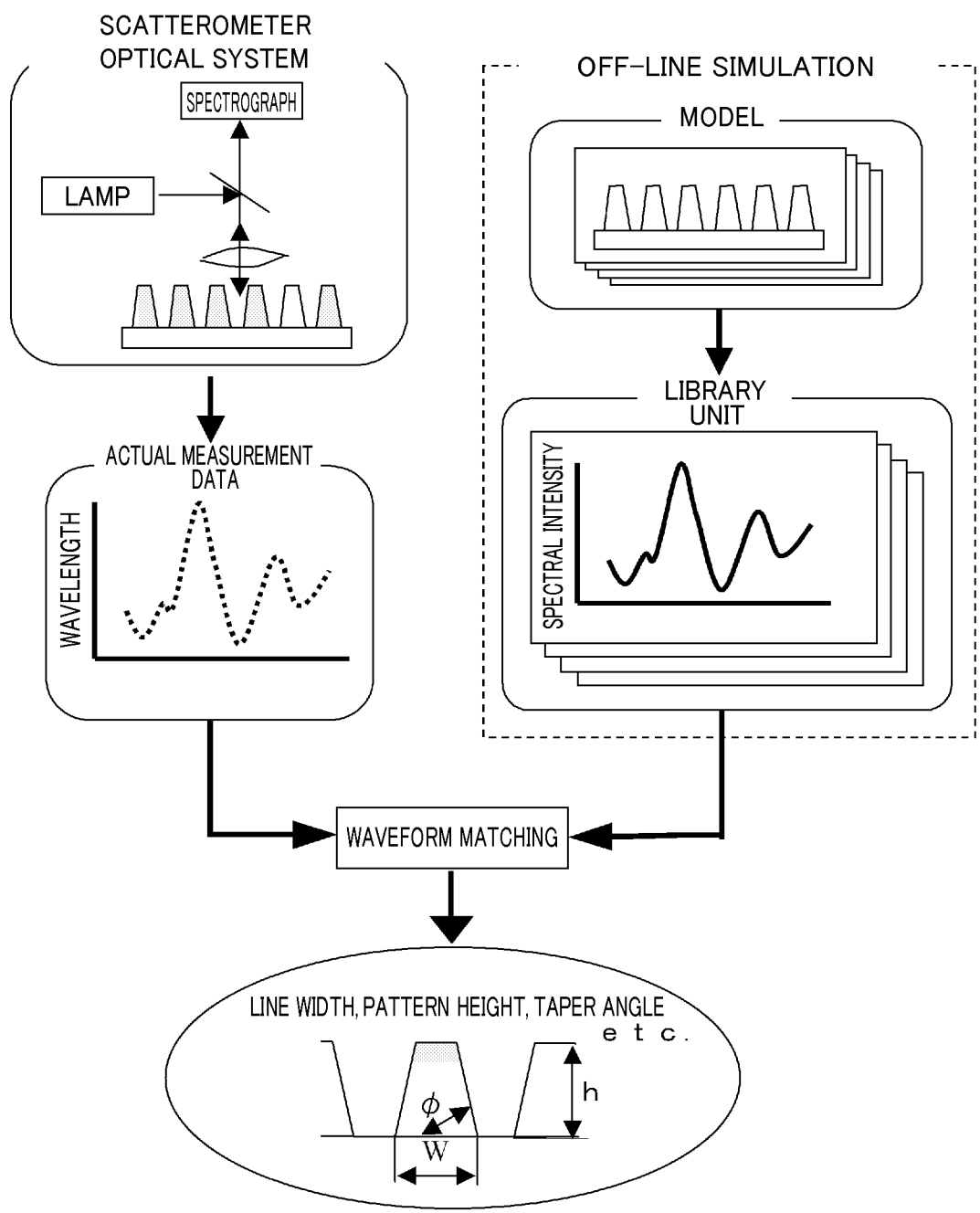
FIG. 21 is a diagram showing the processing flow of scatterometry.

Note that the respective functions explained in the above-described (1) to (3) have been described regarding a case where the model based measurement method is applied to a SEM signal waveform, however, they are applicable to scatterometry shown in FIG. 21.

When the present invention is applied to the scatterometry, the same effects as those described in the above-described embodiments can be obtained.

The invention may be embodied in other specific forms without departing from the spirit or essential characteristics thereof. The present embodiment is therefore to be considered in all respects as illustrative and not restrictive, the scope of the invention being indicated by the appended claims, rather than by the foregoing description, and all changes which come within the meaning and range of equivalency of the claims are therefore intended to be embraced therein.

REFERENCE SIGNS LIST

200 . . . SEM
206 . . . sample
209 . . . image processing unit
212 . . . entire controller
220 . . . model base calculation processing unit
221 . . . model base calculation unit
222 . . . library unit
223 . . . evaluation processing unit
224 . . . input unit
225 . . . output unit
226 . . . display screen

The invention claimed is:

1. A shape measurement method comprising:
creating a group of calculated waveforms (library) corresponding to various cross-sectional shapes by electron beam simulation;
performing image pickup on a pattern formed on a sample with a scanning electron microscope (SEM);
performing matching between a real waveform of an image obtained by the image pickup and the created library and selecting a calculated waveform most coinciding with the real waveform;
determining a plurality of shape parameters to represent a cross-sectional shape of the pattern formed on the sample based on the selected calculated waveform; and
measuring a three-dimensional shape of the pattern, from an image obtained by performing image pickup on the pattern formed on the sample with the SEM using the determined plurality of shape parameters,
wherein the determination of the plurality of shape parameters is performed by supporting setting of shape parameter conditions using the created library, or by checking and determining accuracy of the result of measurement of the three-dimensional shape, or by using both.

2. The shape measurement method according to claim 1, wherein the determination of the plurality of shape parameters, by supporting setting of shape parameter conditions using the created library, is made by performing matching between the calculated waveforms in the created library to obtain solution space (expected solution space), and wherein the plurality of shape parameters to obtain stable solution are determined based on the obtained expected solution space.

3. The shape measurement method according to claim 2, wherein the expected solution space is obtained by the SEM image pickup condition, and the SEM image pickup conditions are determined using the expected solution space obtained by the SEM image pickup condition.

4. The shape measurement method according to claim 1, wherein the determination of the plurality of shape parameters, by checking and determining the accuracy of the result of measurement of the three-dimensional shape, is made by performing matching between the real waveform of the image obtained by performing the image pickup and the calculated waveforms in the created library to obtain solution space (real solution space), and by performing matching between the calculated waveforms in the created library to obtain solution space (reference solution space), and wherein the plurality of shape parameters to obtain stable solution are determined by comparing the obtained real space with the expected solution space.

5. A shape measurement system comprising:
a scanning electron microscope (SEM) unit to perform image pickup on a pattern formed on a sample;
a library creating unit to create a group of calculated waveforms (library) corresponding to various cross-sectional shapes by electron beam simulation;
a model base calculation unit to perform matching between a real waveform of an image obtained by performing image pickup with the SEM unit and the library created with the library creating unit to select calculated waveform most coinciding to the real waveform;
a shape parameter determination unit to determine a plurality of shape parameters to represent a cross-sectional shape of the pattern formed on the sample based on the calculated waveform selected with the model base calculation unit;
a three-dimensional shape measurement unit to measure a three-dimensional shape of the pattern from an image obtained by performing image pickup on the pattern formed on the sample with the SEM using the plurality of shapes parameters determined with the shape parameter determination unit; and
an output unit to output the result of measurement with the three-dimensional shape measurement unit,
wherein the shape parameter determination unit determines the plurality of shape parameters by supporting setting of shape parameter conditions using the created library, or by checking and determining accuracy of the results of measurement of the three-dimensional shape, or by using both.

6. The shape measurement system according to claim 5, wherein the shape parameter determination unit determines the plurality of shape parameters by supporting setting of shape parameter conditions using the created library, by performing matching between the calculated waveforms in the created library to obtain solution space (expected solution space), and determines the plurality of shape parameters to obtain stable solution based on the obtained predicted solution space.

7. The shape measurement system according to claim 6, wherein the shape parameter determination unit obtains the predicted solution space by the SEM image pickup condition, and determines the SEM image pickup conditions using the predicted solution space obtained by the SEM image pickup condition.

8. The shape measurement system according to claim 5, wherein the shape parameter determination unit determines the determination of the plurality of shape parameters, by checking and determining the accuracy of the result of measurement of the three-dimensional shape, by performing matching between the real waveform of the image obtained by performing the image pickup and the calculated waveforms in the created library to obtain solution space (real solution space), and by performing matching between the calculated waveforms in the created library to obtain solution space (reference solution space), and determines the plurality of shape parameters to obtain stable solution by comparing the obtained real space with the predicted solution space.

* * * * *

UNITED STATES PATENT AND TRADEMARK OFFICE
CERTIFICATE OF CORRECTION

PATENT NO. : 9,354,049 B2
APPLICATION NO. : 13/880429
DATED : May 31, 2016
INVENTOR(S) : Chie Shishido et al.

It is certified that error appears in the above-identified patent and that said Letters Patent is hereby corrected as shown below:

On the title page item (73) Assignee:

"HUTACHI HIGH-TECHNOLOGIES CORPORATION, Tokyo (JP)" should read:
-- HITACHI HIGH-TECHNOLOGIES CORPORATION, Tokyo (JP) --

Signed and Sealed this
Twenty-third Day of August, 2016

Michelle K. Lee
*Director of the United States Patent and Trademark Office*